(12) United States Patent
Zhang et al.

(10) Patent No.: US 9,865,622 B2
(45) Date of Patent: Jan. 9, 2018

(54) ARRAY SUBSTRATE AND A METHOD FOR MANUFACTURING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Ming Zhang, Beijing (CN); Zhaohui Hao, Beijing (CN); Woong Sun Yoon, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/389,201

(22) PCT Filed: Nov. 29, 2013

(86) PCT No.: PCT/CN2013/088144
§ 371 (c)(1),
(2) Date: Sep. 29, 2014

(87) PCT Pub. No.: WO2014/190698
PCT Pub. Date: Dec. 4, 2014

(65) Prior Publication Data
US 2015/0318305 A1 Nov. 5, 2015

(30) Foreign Application Priority Data

May 28, 2013 (CN) .......................... 2013 1 0203861

(51) Int. Cl.
*H01L 23/48* (2006.01)
*H01L 27/12* (2006.01)
(Continued)

(52) U.S. Cl.
CPC ...... *H01L 27/124* (2013.01); *G02F 1/136286* (2013.01); *H01L 21/31111* (2013.01);
(Continued)

(58) Field of Classification Search
CPC . G02F 1/1345; G02F 1/13452; G02F 1/13458
(Continued)

(56) References Cited

U.S. PATENT DOCUMENTS 6,636,288 B2 * 10/2003 Kim ...................... G02F 1/1345
349/139
6,829,029 B2 * 12/2004 Park ...................... G02F 1/1345
349/149

(Continued)

FOREIGN PATENT DOCUMENTS

CN          1832184 A      9/2006
CN        102955314 A      3/2013
(Continued)

OTHER PUBLICATIONS

English translation of the Written Opinion of the International Searching Authority of PCT/CN2013/088144, dated Feb. 27, 2014.
(Continued)

*Primary Examiner* — Syed Gheyas
(74) *Attorney, Agent, or Firm* — Collard & Roe, P.C.

(57) ABSTRACT

An array substrate is disclosed. The array substrate comprises a base substrate (4) and signal lines on the base substrate (4). The signal lines comprises a plurality of conductive layers (11, 12) in different layers, and the plurality of conductive layers (11, 12) are provided with insulation layers (21) therebetween, and are connected in parallel through one or more vias (3). Embodiments of the present disclosure further disclose a method for manufacturing the array substrate.

2 Claims, 4 Drawing Sheets

(51) Int. Cl.
*H01L 23/522* (2006.01)
*H01L 21/768* (2006.01)
*H01L 21/311* (2006.01)
*G02F 1/1362* (2006.01)

(52) U.S. Cl.
CPC .. *H01L 21/76802* (2013.01); *H01L 21/76877* (2013.01); *H01L 23/5226* (2013.01); *H01L 27/1259* (2013.01); *G02F 2001/13629* (2013.01); *H01L 2924/0002* (2013.01)

(58) Field of Classification Search
USPC .................................................. 349/143–152
See application file for complete search history.

(56) References Cited

U.S. PATENT DOCUMENTS

| | | | | |
|---|---|---|---|---|
| 6,882,396 B2* | 4/2005 | Ko | ........................ | G02F 1/1345 349/149 |
| 7,948,570 B2* | 5/2011 | Wang | .................. | H01L 27/1288 349/43 |
| 8,809,856 B2* | 8/2014 | Yamazaki | ......... | G02F 1/136227 257/43 |
| 2010/0289977 A1* | 11/2010 | Liu | ........................ | H01L 27/12 349/44 |
| 2011/0069247 A1* | 3/2011 | Zhou | ................. | G02F 1/136227 349/43 |
| 2012/0182490 A1* | 7/2012 | Kim | .................. | G02F 1/134363 349/43 |

FOREIGN PATENT DOCUMENTS

| | | |
|---|---|---|
| CN | 103091921 A | 5/2013 |
| CN | 103296033 A | 9/2013 |
| KR | 20000047012 A | 7/2000 |

OTHER PUBLICATIONS

Chinese Office Action of Chinese Application No. 201310203861.5, dated Mar. 2, 2015 with English translation.
International Search Report, International Preliminary Report on Patentability and Written Opinion of the International Searching Authority of PCT/CN2013/088144 in Chinese, dated Feb. 27, 2014.
Second Chinese Office Action of Chinese Application No. 201310203861.5, dated Aug. 5, 2015 with English translation.
English Translation of the International Search Report of PCT/CN2013/088144 published in English on Dec. 4, 2014.

* cited by examiner

ARRAY SUBSTRATE AND A METHOD FOR MANUFACTURING THE SAME

CROSS REFERENCE TO RELATED APPLICATIONS

This application is the National Stage of PCT/CN2013/088144 filed on Nov. 29, 2013, which claims priority under 35 U.S.C. §119 of Chinese Application No. 201310203861.5 filed on May 28, 2013, the disclosure of which is incorporated by reference.

TECHNICAL FIELD

Embodiments of the present disclosure relates to an array substrate and a method for manufacturing the same.

BACKGROUND

In a thin film field effect transistor plane display screen, especially a thin film field effect transistor liquid crystal display (abbreviated as TFT-LCD), the liquid crystal pixels are driven by using TFTs arranged in a matrix, corresponding capacitors, and so on, so as to produce colorful images. The TFT-LCD is widely used in televisions, notebooks, PDAs, and electronic products having display function therein due to its low profile, low power consumption, and irradiation free.

With the size of the TFT-LCD becoming larger and larger, the scan frequency and the resolution are also required to be higher and higher. As the performance of the product is improving, problems caused by the signal delay is more and more significant, and need to be addressed.

SUMMARY

One of problems to be solved by the embodiments of the present disclosure is to reduce resistance of signal lines in the array substrate, and thus reduce the possibility that signal delay occurs in the TFT-LCD.

In order to solve the problem mentioned above, at lease one embodiment of the present disclosure provides the technical solution as follows:

An array substrate comprising a base substrate and signal lines disposed on the base substrate, wherein the signal lines comprise a plurality of conductive layers disposed in different layers, and between the plurality of conductive layers, an insulation layer is provided, and the plurality of conductive layers are connected in parallel by one or more vias.

The projections of the plurality of the conductive layers on the base substrate overlaps.

The signal lines can be gate lines, and the plurality of conductive layers comprise a gate metal layer, and further comprise at least one of a data line layer disposed in a gate line region and a pixel electrode layer disposed in the gate line region.

The signal lines can be data lines, and the plurality of conductive layers comprise a data line layer, and further comprise at least one of a gate metal layer disposed in the date line region and a pixel electrode layer disposed in the data line region.

When the projections of at least two signal lines on the base substrate overlaps, each of the signal line only comprise one conductive layer at the overlapping point.

Embodiments of the present disclosure provides an array substrate, signal lines on the array substrate comprise a plurality of conductive layers disposed in different layers, and the plurality of conductive layers are connected in parallel through a via to reduce resistance of the signal lines. The signal lines have simple structures, the possibility that signal delay occurs in the TFT-LCD is effectively reduced.

According to another aspect of the present disclosure, there is provided a method for manufacturing an array substrate, the method at least comprises:

forming a first conductive layer and a first insulation layer through deposition on a base substrate;

forming a via, wherein the via are formed by etching the first insulation layer to form a via passing through the first insulation layer; and forming a second conductive layer through deposition, wherein the second conductive layer is formed by depositing on the first insulation layer and the via, and the first conductive layer and the second conductive layer are connected in parallel through the via.

After forming the second conductive layer by deposition, the method can further comprise:

forming a second insulation layer on the second conductive layer;

etching the second insulation layer disposed in the via; and forming a third conductive layer by deposition on the second insulation layer and the via, wherein the first, second and third conductive layers are connected in parallel through the via.

After forming the first conductive layer and the second conductive layer by deposition on the base substrate, the method can further comprise:

subsequently forming the third conductive layer and the second insulation layer by deposition;

and forming a via comprises:

Etching the second insulation layer, the third conductive layer and the first insulation layer at the area corresponding to the via, to form a via passing through the second insulation layer, the third conductive layer and the first insulation layer.

The step of forming the second conductive layer by deposition on the second insulation layer and the via so that the first conductive layer and the second conductive layer are connected in parallel through the via comprises:

Forming a second conductive layer by deposition on the base substrate such that the first conductive layer, the third conductive layer and the second conductive layer are connected in parallel through the via.

After forming the first conductive layer and the first insulation layer by deposition on the base substrate, the method further comprises:

forming a third conductive layer by deposition on the first insulation layer;

and the step of forming a via comprises;

etching the third conductive layer at the area corresponding to the via;

forming a second insulation layer by deposition, and etching the second insulation layer and the first insulation layer at the area corresponding to the via to form the via passing through the second insulation layer, the third conductive layer, and the first insulation layer;

and forming a second conductive layer by deposition on the base substrate such that the first conductive layer and the second conductive layer are connected in parallel through the via comprises:

forming a second conductive layer by deposition on the base substrate such that the first conductive layer, the third conductive layer and the second conductive layer are connected in parallel through the via.

The signal lines are gate lines, and the first conductive layer is a gate metal layer, and the second conductive layer is a data line layer disposed in the gate line region, and the third conductive layer is a pixel electrode layer disposed in the gate line region; or, the signal lines are data lines, and the first conductive layer is a gate metal layer disposed in the data line region, the second conductive layer is a data line layer, and the third conductive layer is a pixel electrode layer disposed in the data line region.

The signal lines are gate lines, and the first conductive layer is a gate metal layer, and the third conductive layer is a data line layer disposed in the gate line region, and the second conductive layer is a pixel electrode layer disposed in the gate line region; or The signal lines are date lines, and the first conductive layer is a gate metal layer disposed in the data line region, the third conductive layer is a data line layer disposed in the date line region, and the second conductive layer is a pixel electrode layer disposed in the data line region.

In an embodiment of the present disclosure, a method for manufacturing an array substrate is provided, the array substrate manufactured by this method has signal lines comprising a plurality of conductive layers disposed in different layers and connected in parallel through a via, whereby the resistance of the signal lines can be reduced, and the signal lines have simple structures such that the possibility that signal delay occurs in the TFT-LCD is effectively reduced. Furthermore, the method can be easily performed, and thus can be widely used.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

One embodiment of the present disclosure provides an array substrate, the array substrate comprises a base substrate 4 and signal lines disposed on the base substrate, the signal lines comprise:

A plurality of conductive layers located on different layers, provided with insulation layers therebetween and connected in parallel through one or more vias.

For convenience of description, the signal lines with two conductive layers structure is described as an example in one embodiment of the present disclosure. But it should be understood that the number of the conductive layers can be arbitrarily provided as necessary, and the present disclosure will not be limited thereto.

Figure 1:
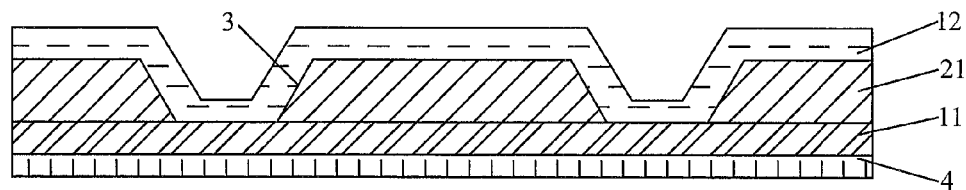
FIG. 1 is a schematic cross-section view illustrating the signal lines in the array substrate according to one embodiment of the present disclosure.

As illustrated in FIG. 1, the signal lines comprise two conductive layers disposed in different layers and an insulation layer provided between the two conductive layers. For the sake of distinguishing and description, the two conductive layers, from top to bottom, are respectively referred to as the first conductive layer 11 and the second conductive layer 12, and accordingly, the insulation layer is referred to as the first insulation layer 21.

In FIG. 1, when depositing the second conductive layer 12, a portion of the conductive material is deposited in the vias 3, and the two vias 3 on the signal line are equivalent to two nodes in a circuit, and whereby the parallel connection between the first conductive layer 11 and the second conductive layer 12 is achieved. On the basis of the physical principle, it can be seen that the resistance value of resistors connected in parallel is smaller than the resistance of each resistor connected in parallel, thus the resistance of the signal lines are reduced.

Since the resistance of the signal lines is reduced in the embodiment of the present disclosure, the width of the signal lines may be further narrowed to improve the aperture ratio of the pixels, while the data can be quickly transmitted in the TFT signal lines and the signal delay phenomena is eliminated or at least reduced.

In order to guarantee effect of the parallel connection of the conductive layers in the signal lines, the projections of the plurality of conductive layers disposed in different layers on the base substrate 4 overlap. The number of the vias provided in the insulation layer interposed between the different layers can be one. In order to guarantee the parallel connection of the conductive layers in the signal lines, the number of the vias may be more than one.

As well known, the array substrate is a multi-layer structure, comprises a gate layer, a gate insulation layer, an active layer, a data line layer, a passivation layer, a pixel electrode layer, and so on. In manufacturing the array substrate, a gate layer, a gate insulation layer, an active layer, a data line layer, a passivation layer and a pixel electrode layer, etc. are sequentially deposited on one side of the entire base substrate 4. After or in the deposition of all the layers, the layer structure with desired shape can be obtained through etching the layers, thereby manufacturing the array substrate.

Taking the gate line as example, in conventional arts, when manufacturing other components (e.g. TFT) on the array substrate, the layer structures other than the gate layer and the gate insulation layer at the gate wiring position on the array substrate are all removed. While in the present embodiment, these removed layers is remained and used.

Figure 2:
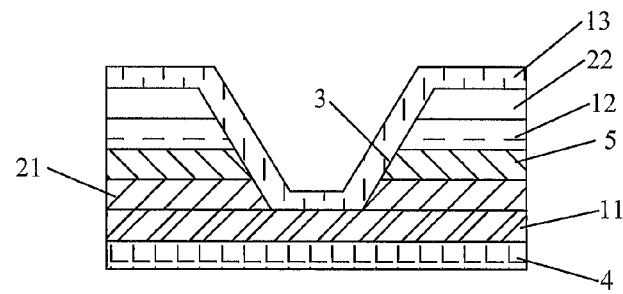
FIG. 2 is a schematic cross-section view illustrating the signal lines in the array substrate according to another embodiment of the present disclosure.

When the signal lines are gate lines, the plurality of conductive layers comprise gate metal layers, and data line layers and pixel electrode layers disposed in the gate line region. For example, as illustrated in FIG. 2, from bottom to top, the array substrate sequentially comprises a gate layer (the first conductive layer 11), a gate insulation layer (the first insulation layer 21), an active layer 5, a data line layer (the second conductive layer 12), a passivation layer (referred to as the second insulation layer 22, correspondingly), and a pixel electrode layer (referred to as the third conductive layer 13, correspondingly). In FIG. 2, the inner wall and the bottom of the via are covered with part of the third conductive layer 13, to connect in parallel the first conductive layer 11, the second conductive layer 12 and the third conductive layer 13 which are separated by the insulation layers, in order to reduce the resistance of the gate lines.

In addition, as illustrated in FIG. 2, the third conductive layer 13 covers the inner wall and the bottom of the via 3, and the first conductive layer 11, the second conductive layer 12 and the third conductive layer 13 are connected in parallel through the via 3. But, in fact, the depth of the via is generally so large that the inner wall of the via 3 can not be totally covered only by depositing the third conductive layer 13, causing that the first conductive layer 11, the second conductive layer 12 and the third conductive layer 13 can not be effectively connected in parallel, and thus the effect of reducing the resistance of the signal lines is impaired.

Figure 3:
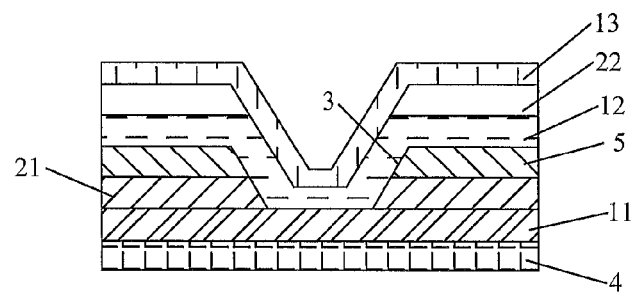
FIG. 3 is a schematic cross-section view illustrating the signal lines in the array substrate according to yet another embodiment of the present disclosure.

Therefore, as illustrated in FIG. 3, by depositing the second conductive layer 12 and the third conductive layer 13 on the inner wall and bottom of the via 3, the thickness of the inner wall of the via 3 needs to be covered by each conductive layer is reduced, and deposition of the conductive layer on the inner wall of the via 3 is carried out twice, thus the reliability of the conductive layers totally covering the inner wall of the via 3 is improved, so that the conductive layers are effectively connected in parallel, and the reliability of the signal lines are improved.

The active layer 5 is generally made of semiconductor materials, and semiconductor materials herein mean materials whose conductivity are between a conductor and an insulator at room temperature. In the embodiment of the present disclosure, the conductive layers covering the inner wall of the via are connected to the active layer 5, and thus the active layer 5 also takes part in conduction of the signal lines, and also functions to reduce the resistance of the signal lines, although not very much.

In addition, the structure of the signal lines according to the present disclosure may not comprise the active layer 5 and the passivation layer (the second insulation layer 22), it will not influence the effect of decreasing the resistance of the signal lines.

As above mentioned, when the signal lines are gate lines, the plurality of conductive layers in different layers comprise a gate metal layer, a data line layer disposed in the gate line region and a pixel electrode layer disposed in the gate line region.

Given that the signal delay does not occur in the array substrate, the pixel electrode layer (the third conductive layer 13) disposed in the gate line region can be removed, whereby the plurality of conductive layers in different layers comprise a gate metal layer and a data line layer disposed in the gate line region.

Besides the gate lines, the data lines and the like disposed on the array substrate can also adopt the signal lines having the above structure. When the signal lines are data lines, the plurality of conductive layers in different layers comprise a data line layer disposed in the data line region, and further comprise at least one of a gate metal layer disposed in the data line region and a pixel electrode layer disposed in the data line region.

Figure 4:
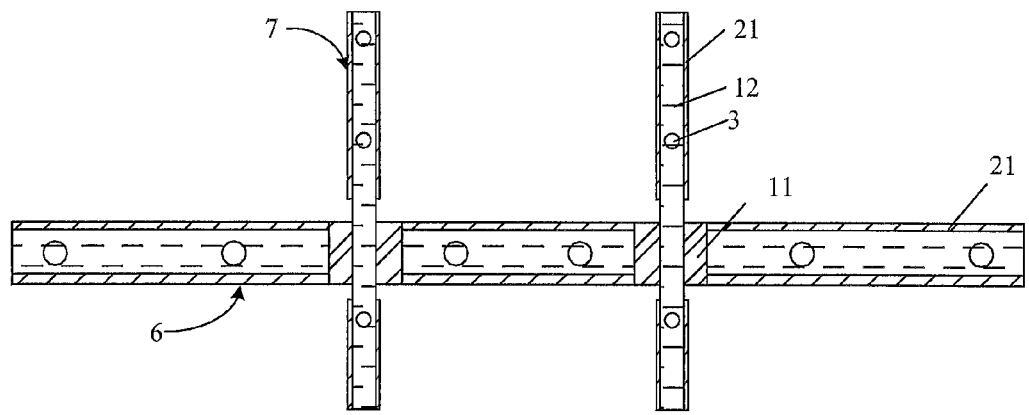
FIG. 4 is a schematic view illustrating the overlapping position of the projections of a gate line and a data line according to an embodiment of the present disclosure.

Since the projections of the gate line and the data line partially overlap, at the overlapping position, if the signal lines with multi-layer conductive layers are used, there will be a short circuit between the gate line and the data line, and meantime, the parasite capacitance at the overlapping position of projections will be increased. Therefore, as illustrated in FIG. 4, at the overlapping position of projections of the gate line 6 and the data line 7, that is, at the location where the projections of the two signal lines overlap, each of the signal lines will only remain one of the conductive layers, and as conventionally, the single conductive layer will be conducted alternately, that is, here, the gate layer (the first conductive layer 11) will only remain as the gate line, and here, the data line layer (the second conductive layer 12) will only remain as the data line.

In an embodiment corresponding to FIG. 1, the conductive layers are formed by depositing one or more materials selected from metals and ITO, and the insulation layer is formed by depositing one or more materials selected from silicon oxide, silicon nitride, and organic insulation materials. For example, in some embodiments, the second insulation layer 22 can be removed, which is equivalent to coating the third conductive layer directly on the second conductive layer 12 in the signal line structure as illustrated in FIG. 1, which will increase the thickness of the second conductive layer 12 and reduce the resistance of the signal lines illustrated in FIG. 1.

In the technical solution of the present embodiment, an array substrate is provided, the signal lines on the array substrate comprise a plurality of conductive layers in different layers, and the plurality of conductive layers are connected in parallel through a via, whereby the resistance of the signal lines is reduced. The signal lines have simple structure, and can effectively reduce the possibility of signal delay occurring in the TFT-LCD.

Second Embodiment

The embodiment of the present disclosure provides a method for manufacturing an array substrate, the method comprises:

Step S101, forming a first conductive layer and a first insulation layer by deposition on a base substrate;

Step S102, etching the first insulation layer to form a via passing through the first insulation layer;

Step S103, forming a second conductive layer on the first insulation layer and the via to cover the inner wall and the bottom of the via so that the first conductive layer and the second conductive layer are connected in parallel through the via.

By the above steps, signal lines in the array substrate as illustrated in FIG. 1 are obtained. In FIG. 1, the two vias in the signal lines are equivalent to two nodes in a circuit, and when depositing the second conductive layer 12, a portion of the second conductive layer 12 is deposited in the via 3, so that the parallel connection between the first conductive layer 11 and the second conductive layer 12 is achieved. As well known, the total resistance of the resistors connected in parallel is smaller than the resistance of any of the resistors to be connected in parallel, thus, the resistance of the signal lines is reduced. This method is easily performed and suitable to be widely used.

In the technical solution of the present embodiment, a method for manufacturing an array substrate is proposed. The signal lines made by this method have at least two conductive layers, and the at least two conductive layers are connected in parallel, whereby the resistance of the signal lines is reduced, and the possibility of signal delay occurring in the signal lines effectively decreases. This method is easily operated and suitable to be widely used.

The above signal lines may be used as data lines, gate lines and the like on the array substrate. Hereinafter, the description will be given by taking gate line on the array substrate as an example, and data lines or other signal lines can be manufactured in a similar process.

Figure 5A:
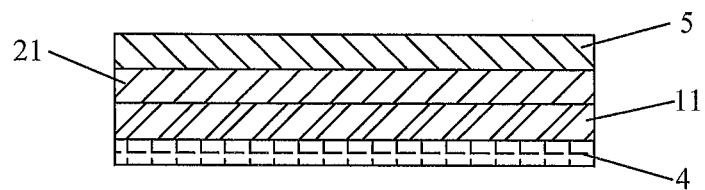
FIGS. 5a to 5c are schematic views illustrating the structures obtained by the processes in one method for manufacturing the array substrate according to an embodiment of the present disclosure.
Figure 5B:
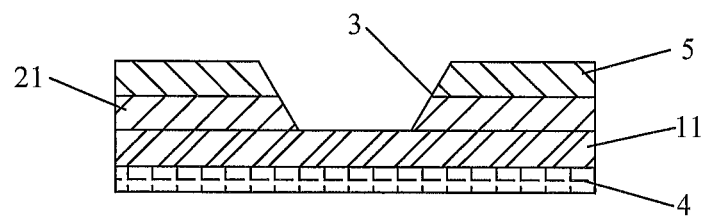
Figure 5C:
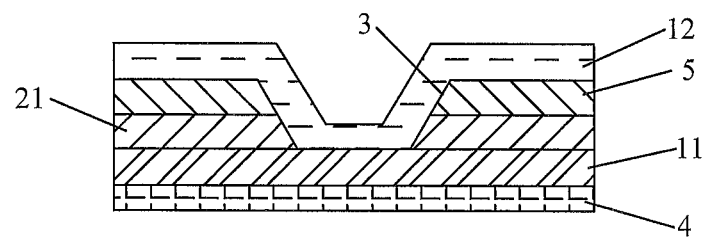

As illustrated in FIG. 5a, a gate layer (i.e. the first conductive layer 11), a gate insulation layer (i.e. the first insulation layer 21), and an active layer 5 are deposited on the base substrate 4. A mask can be applied on the area of the active layer 5 corresponding a via 3 to expose the area corresponding to the via, an etching process is carried out to form the via 3 passing through the active layer 5 and the first insulation layer 21, as illustrated in FIG. 5b. A data line layer (i.e. the second conductive layer 12) is deposited on the area comprising the active layer 5 and the via 3, so that the first conductive layer 11 and the second conductive layer 12 are connected in parallel through a portion of the data line layer covering the inner wall and the bottom of the via 3, as illustrated in FIG. 5c.

Furthermore, if the resistance of the signal lines needs to be further reduced, the number of the conductive layers can be increased, after the step S103, the method can further comprise:

Step S104, forming a second insulation layer by deposition on the second conductive layer;

Step S105, etching the second insulation layer in the via;

Step S106, forming a third conductive layer on the second insulation layer and the via by deposition so that the first, second and third conductive layers are connected in parallel through the via.

After the above steps, the signal line structure as shown in FIG. 3 can be obtained.

Figure 6A:
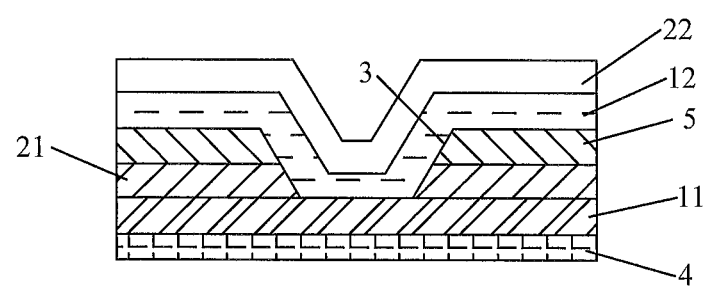
FIGS. 6a to 6b are schematic views illustrating the structures obtained by the processes in another method for manufacturing the array substrate according to an embodiment of the present disclosure.
Figure 6B:
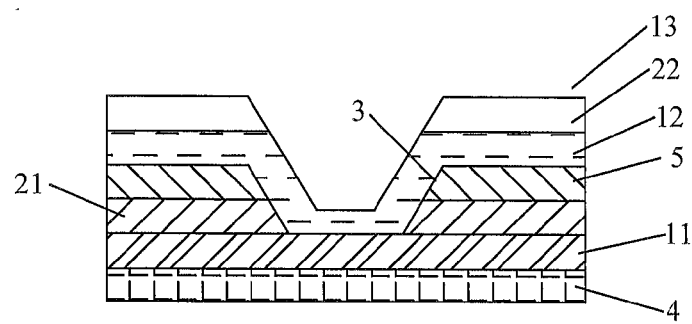

Taking the gate lines on the array substrate as an example, as illustrated in FIG. 6a, a passivation layer (i.e. the second insulation layer 22) is deposited on the data line layer (the second conductive layer 12); a layer of mask is applied so as to only expose an portion of the via covered by the second conductive layer 12 and the second insulation layer 22, etching is carried out so that the second insulation layer 22 in the via 3 is removed, so as to obtain the structure as illustrated in FIG. 6b Finally, a third conductive layer 13 is deposited on the second insulation layer 22 and via 3 to obtain the signal line structure as illustrated in FIG. 3. In the embodiment of the present disclosure, the third conductive layer 13 is a pixel electrode layer.

The second conductive layer 12 and the third conductive layer 13 sequentially covering the inner wall and the bottom of the via enable the first conductive layer 11, the second conductive layer 12 and the third conductive layer 13 to be connected in parallel with each other.

In the two methods described above, the signal lines are gate lines, and the first conductive layer 11 is a gate metal layer, the second conductive layer 12 is a data line layer disposed in the gate line region, and the third conductive layer 13 is a pixel electrode layer disposed in the gate line region; alternatively, the signal lines are data lines, and the first conductive layer 11 is a gate metal layer disposed in the data line region, the second conductive layer 12 is a data line layer, and the third conductive layer is a pixel electrode layer located in the data line region.

An embodiment of the present disclosure provides another method for making signal lines having three conductive layers connected in parallel with each other, the method comprising following steps:

Step S101, forming a first conductive layer and a first insulation layer by deposition on a base substrate;

Step S102, sequentially forming a third conductive layer and a second insulation layer by deposition on the first insulation layer;

Step S202, in the area corresponding to a via, etching the first insulation layer, the third conductive layer and the second insulation layer to form a via passing through the first insulation layer, the third conductive layer, and the second insulation layer;

Step S203, forming the second conductive layer on the second insulation layer by deposition, so that the first conductive layer, the third conductive layer, and the second conductive layer are connected in parallel with each other through the via.

Hereinafter, the above steps will be further described by taking gate lines on the array substrate as an example.

Figure 7A:
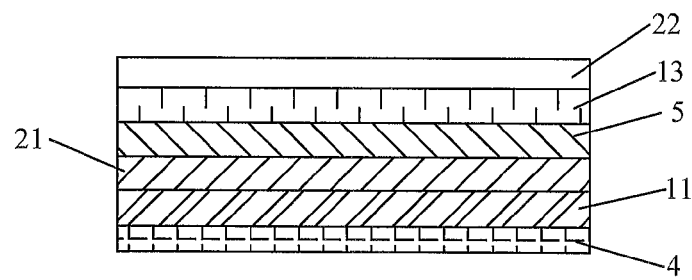
FIGS. 7a to 7c are schematic views illustrating the structures obtained by the processes in still another method for manufacturing the array substrate according to an embodiment of the present disclosure.
Figure 7B:
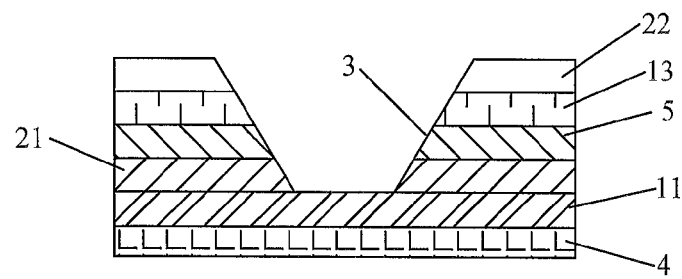
Figure 7C:
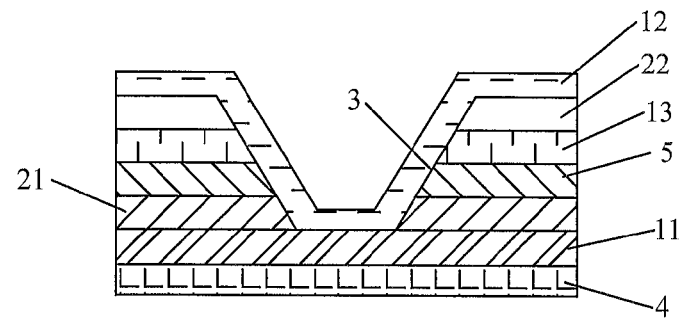

As illustrated in FIG. 7a, a gate layer (i.e. the first conductive layer 11), a gate insulation layer (i.e. the first insulation layer 21), an active layer 5, a data line layer (i.e. the third conductive layer 13), a passivation layer (i.e. the second insulation layer 22) are sequentially deposited on the base substrate, after that, by means of a layer of mask, the area corresponding to a via 3 is exposed, and the second insulation layer 22, the third conductive layer 13, the active layer 5, the first insulation layer 21 are sequentially etched to form the via 3 passing through the second insulation layer 22, the third conductive layer 13, the active layer 5 and the first insulation layer 21, thus the structure as illustrated in FIG. 7b is formed. The second conductive layer 12 as a pixel electrode layer is finally deposited, so as to form data lines as illustrated in FIG. 7c, and the second conductive layer 12 deposited on the inner wall and the bottom of the via 3 enable the first conductive layer 11, the second conductive layer 12 and the third conductive layer 13 to be connected in parallel with each other, in order to reduce the resistance of the signal lines.

In one embodiment of the present disclosure, while connecting TFT with the pixel electrode layer in the pixel region through the via, the method comprising the steps S201 to S203 can be employed, to form the signal lines with such a structure. For example, a mask layer formed of photoresist can be used to expose the area of a via to be etched, the passivation layer 22 in the area of the via 3 is removed by dry etching, after that, the data line layer 13 in the area of the via 3 is removed by wet etching in the via etching processes, then the active layer 5 in the area of the via 3 is removed by dry etching in the via etching processes, finally, the gate insulation layer 21 in the area of the via 3 is removed by dry etching in the via etching processes.

After removing the active layer in the area of the via 3, the photoresist as the mask between the TFT and the pixel electrode layer of the pixel region will be removed by ashing process in dry etching, so as to remove the passivation layer on the via between the TFT and the pixel electrode layer of the pixel region while removing the gate insulation layer in the via 3 by dry etching. Meantime, the passivation layer and the gate insulation layer at the connection port of the base substrate 4 connecting with IC chip needs also to be removed, such processing can be done through well known means in the conventional art.

In addition, the method for making signal lines having three conductive layers electrically connected with each other can be carried out according to following steps:

Step S101, forming the first conductive layer and the first insulation layer by deposition on a base substrate;

Step S301, forming the third conductive layer by deposition on the first insulation layer;

Step S302, etching the third conductive layer in the area corresponding to a via;

Step 303, forming a second insulation layer by deposition, and etching the second insulation layer and the first insulation layer in the area corresponding to the via, to form the via passing through the first insulation layer, the third conductive layer and the second insulation layer.

The method may further comprise following steps:

Step S304, forming the second conductive layer by deposition on the second insulation layer and the via so that the first, second and third conductive layers are connected in parallel with each other through the via.

Hereinafter, the method comprising the steps S301 to S304 will be described by taking gate lines on the array substrate as an example.

Figure 8A:
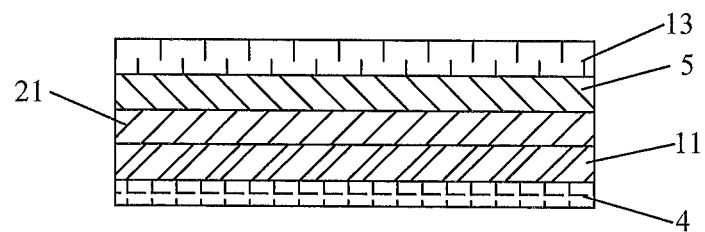
FIGS. 8a to 8d are schematic views illustrating the structures obtained by the processes in yet another method for manufacturing the array substrate according to an embodiment of the present disclosure.
Figure 8B:
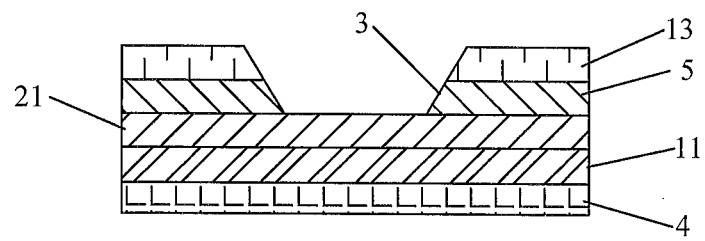
Figure 8C:
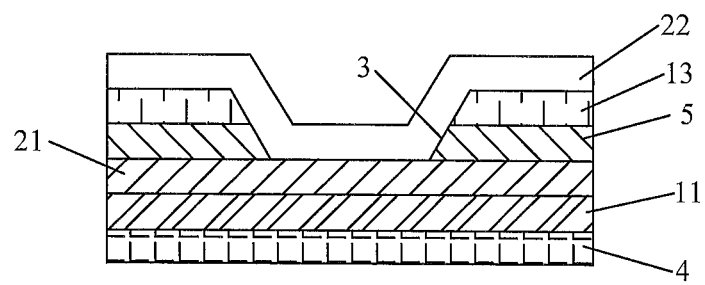
Figure 8D:
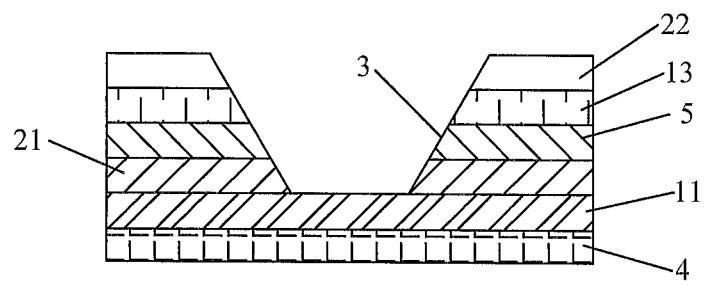

As illustrated in FIG. 8a, a gate layer (the first conductive layer 11), a gate insulation layer (the first insulation layer 21), an active layer 5, a data line layer (the third conductive layer 13) are sequentially formed by deposition on a base substrate. After that, the third conductive layer 13 is covered with a layer of mask, to expose the area corresponding to a via 3 and etch the third conductive layer 13. Meantime, the active layer 5 is etched, as illustrated in FIG. 8b. Then, as illustrated in FIG. 8c, a second insulation layer 22 is deposited on the third conductive layer 13, here, the second insulation layer being a passivation layer. As illustrated in FIG. 8d, through etching by via etching process in the conventional art etching processes, the second insulation layer 22 and the first insulation layer 21 in the area corresponding to the via 3 are removed to form the via 3 passing through the first insulation layer 21, the third conductive layer 13 and the second insulation layer 22. Finally, as illustrated in FIG. 7c, a second conductive layer 12 is deposited on the base substrate 4 so that a portion of the second conductive layer is adhered to the inner wall of the via 3 and a portion of the second conductive layer 12 is deposited on the bottom of the via 3, thus enabling the first conductive layer 11, the second conductive layer 12 and the third conductive layer 13 to be connected in parallel with each other.

In one embodiment of the present disclosure, the method comprising the steps S301 to S304 can particularly comprise: while carrying out a mask process to data line layer and active layer on TFT portion, a mask will not be remained in the area for the via 3 in the signal lines portion, that is, exposing the area for the via 3, the data line layer (the third conductive layer 13) and the active layer 5 in the area for the via 3 will be etched off. After that, a passivation layer is deposited on the data line layer 13 and the via 3, and the passivation layer and the gate insulation layer in the area for the via 3 can be etched by dry etching process, a common via etching process, and finally, a pixel electrode layer is deposited, thereby parallel connection of the pixel electrode layer, the data line layer and the gate layer can be achieved.

It should be noted that the three methods described above can also be used to make the signal lines comprising four or even more conductive layers, and also can be performed while forming the TFT, it will not be further described in any detail.

Therefore, the method according to the embodiments of the present disclosure is easily performed, and is of high operability. Wherein the method comprising the steps S201 to S203 can be performed while forming the connection structure between the pixel electrodes and the data lines through four layers of masking process, the method comprising the steps S301 to S304 can be carried out while performing a masking process for the data line layer and active layer masking process in the four layers of mask process, without adding other steps to the conventional process. The method comprising the steps 101 to 106 needs to add one masking process to the existing masking processes required for forming TFT, to form the via before forming the data line layer, so as to achieve the parallel connection between the data line layer and the gate layer. Although there is an additional masking process for etching and making, the signal lines made by the method comprising the steps S101 to S106 have higher reliability than the signal lines made by the method comprising the steps S201 to S203 or the method comprising the steps S301 to S304, and the signal lines made by the steps S101 to S106 has higher practicability.

It should be noted that, it can be seen from the above description that the structure of the signal lines made by the method comprising the steps S201 to S203 and the method comprising the steps S301 to S304 is identical with the structure of the signal lines as illustrated in FIG. 2.

The first conductive layer 11, the second conductive layer 12 and the third conductive layer 13 can be formed by depositing one or more materials selected from metals and ITO, and the first insulation layer and the second insulation layer can be formed by one or more materials selected from silicon oxide, silicon nitride, and organic insulating materials. For example, the first conductive layer 11 can comprise a gate layer (a metal material) and ITO, to increase the thickness of the first conductive layer 11 and reduce the resistance of the signal lines, and reduce the possibility of signal delay in the TFT-LCD. For example again, in some products, the second insulation layer 22 can be removed, which is equivalent to coating the third conductive layer directly on the second conductive layer 12 on the basis of the structure of the signal lines as illustrated in FIG. 1, which increases the thickness of the second conductive layer 12 and reduce the resistance of the signal lines, as illustrated in FIG. 1.

The foregoing are merely exemplary embodiments of the invention, but are not used to limit the protection scope of the invention. The protection scope of the invention shall be defined by the attached claims.

The invention claimed is:

1. A method for manufacturing an array substrate, the array substrate comprising a base substrate and signal lines disposed on the base substrate, wherein the array substrate further comprise a plurality of conductive layers disposed in different layers, the plurality of conductive layers are provided with insulation layers therebetween and are connected in parallel with each other through one or more vias, wherein the method comprises:

forming a first conductive layer and a first insulation layer by deposition on a base substrate;

etching the first insulation layer to form a via passing through the first insulation layer;

forming a second conductive layer by deposition on the base substrate, wherein the second conductive layer is formed by deposition on the first insulation layer and in the via such that the first conductive layer and the second conductive layer are connected in parallel with each other through the via;

and wherein, after forming the first conductive layer and the first insulation layer by deposition on the base substrate, the method further comprises:

sequentially forming a third conductive layer and a second insulation layer by deposition on the first insulation layer;

forming the via comprises;

etching the second insulation layer, the third conductive layer and the first insulation layer to form the via passing through the second insulation layer, the third conductive layer and the first insulation layer;

forming the second conductive layer by deposition comprises:

forming the second conductive layer by deposition on the second insulation layer and in the via such that the first conductive layer, the third conductive layer and the second conductive layer are connected in parallel through the via;

wherein the signal lines are gate lines, the first conductive layer is a gate metal layer, the third conductive layer is a data line layer disposed in a gate line region, and the second conductive layer is a pixel electrode layer disposed in the gate line region; or the signal lines are data lines, the first conductive layer is a gate metal layer disposed in a data line region, the third conductive layer is a data line layer disposed in a data line region, and the second conductive layer is a pixel electrode layer disposed in the data line region, wherein at the overlapping position of projections of the gate lines and the data lines, each of the signal lines will only have one of the conductive layers, that is the gate layer will only remain as the gate line and the data line layer will only remain as the data line.

2. The method according to claim 1, further comprising forming a semiconductor layer, which is connected to the signal lines so as to reduce resistance.

* * * * *